US 6,674,157 B2

(12) United States Patent
Lang (10) Patent No.: US 6,674,157 B2
(45) Date of Patent: Jan. 6, 2004

(54) SEMICONDUCTOR PACKAGE COMPRISING VERTICAL POWER TRANSISTOR

(75) Inventor: Dennis Lang, Sunol, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 76 days.

(21) Appl. No.: 10/052,945

(22) Filed: Nov. 2, 2001

(65) Prior Publication Data

US 2003/0085464 A1 May 8, 2003

(51) Int. Cl.[7] ................................................ H01L 23/48
(52) U.S. Cl. ...................... 257/678; 257/691; 257/329; 257/328
(58) Field of Search ................................ 257/678, 691, 257/329, 328, 401, 204, 202

(56) References Cited

U.S. PATENT DOCUMENTS

| 4,193,083 | A |   | 3/1980  | Max |
|-----------|---|---|---------|-----|
| 4,213,141 | A |   | 7/1980  | Colussi |
| 4,393,392 | A |   | 7/1983  | Hale |
| 4,896,196 | A | * | 1/1990  | Blanchard et al. .......... 357/23.4 |
| 5,084,750 | A | * | 1/1992  | Adlerstein .................... 357/34 |
| 5,095,343 | A |   | 3/1992  | Klodzinski et al. |
| 5,309,014 | A |   | 5/1994  | Wilson |
| 5,513,072 | A |   | 4/1996  | Imaji et al. |
| 5,610,085 | A | * | 3/1997  | Yuan et al. ................... 437/29 |
| 5,623,151 | A | * | 4/1997  | Ajit ............................. 257/212 |
| 5,637,907 | A | * | 6/1997  | Leedy ......................... 257/437 |
| 5,843,813 | A | * | 12/1998 | Wei et al. .................... 438/200 |
| 5,889,319 | A |   | 3/1999  | Moller et al. |
| 5,986,338 | A | * | 11/1999 | Nakajima .................... 257/700 |
| 6,020,617 | A |   | 2/2000  | Jos |
| 6,069,386 | A |   | 5/2000  | Jos |
| 6,133,634 | A |   | 10/2000 | Joshi |
| 6,177,834 | B1|   | 1/2001  | Blair et al. |
| 6,211,462 | B1|   | 4/2001  | Carter, Jr. et al. |

OTHER PUBLICATIONS

Wood et al., "High Performance Silicon LDMOS Technology for 2GHz RF Power Amplifier Applications," IEEE, pp. 4.2.1–4.2.4, 0–7803–3393–4 (1996).

* cited by examiner

Primary Examiner—Kamand Cuneo
Assistant Examiner—Lourdes Cruz
(74) Attorney, Agent, or Firm—Townsend and Townsend and Crew LLP (57) ABSTRACT

A semiconductor die package is disclosed. In one embodiment, the die package includes a semiconductor die having a vertical power transistor, a first surface and a second surface. A ground plane proximate the second surface and distal to the first surface. A bus member covers a portion the first surface of the semiconductor die and has at least one leg that electrically couples a source region of the semiconductor die to the ground plane.

19 Claims, 6 Drawing Sheets

SEMICONDUCTOR PACKAGE COMPRISING VERTICAL POWER TRANSISTOR

BACKGROUND OF THE INVENTION

Embodiments of the invention are directed semiconductor packages, and in particular to semiconductor packages for radio frequency (RF) circuit applications.

Radio frequency (RF) amplifiers are used in wireless communication networks. In recent years, the operating frequencies of wireless networks have increased and are now into the gigahertz (GHz) frequencies. At such high frequencies, power transistors have been used in RF power amplification devices, e.g., in antenna base stations.

Figure 1:
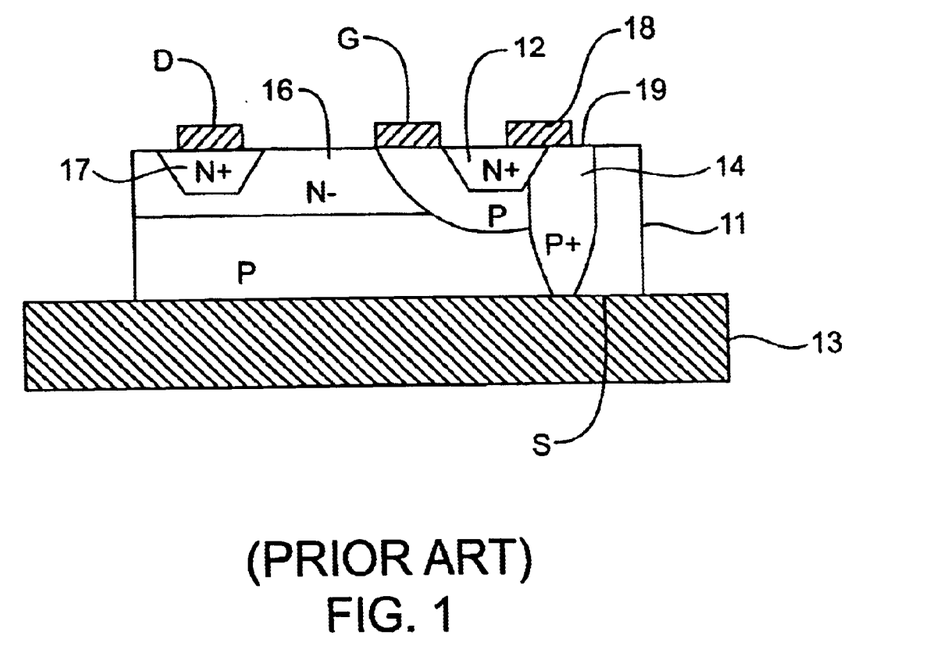
FIG. 1 shows a portion of a simplified conventional LDMOS power RF transistor package.

A simplified illustration of a portion of an LDMOS RF power transistor package is shown in FIG. 1. FIG. 1 shows a semiconductor die 11 with an N+ source region 12 and an N+ drain region 17 at the top surface. The source region 12 electrically connects to a source electrode S at the bottom surface of the semiconductor die 11. A P+ region 14 provides a conductive path to the N+ source region 12. A metal portion 18 shorts out a p+ body region 19 and the N+ source region 12 to provide an electrical path between the source region 12 to the source electrode S. A drain electrode D and a gate G are also at the top surface of the semiconductor die 11. For clarity of illustration, the gate oxide corresponding to the gate G is not shown in FIG. 1. The source electrode S at bottom surface of semiconductor die 11 is attached to a metallic substrate 13. The metallic substrate 13 serves as both a heat sink and a ground reference for the source electrode S. Wires (not shown) are coupled to the gate electrode G and the drain electrode D to provide the semiconductor die 11 with input and output connections. In operation, source current flows from the metallic substrate 13, laterally through the drift region 16 to the drain region 17, and out of the semiconductor die 11 to a wire (not shown) coupled to the drain electrode D.

RF power transistors generate a significant amount of heat. For example, 50% efficiency is not a typical of class A amplifiers. For high output power applications (e.g., more than 60 Watts), special packaging is required to remove heat from the power transistor to prevent overheating and further loss of efficiency. Overheating can also degrade the operational characteristics of a power transistor. For some applications, it is desirable to keep the temperature of the semiconductor die in an RF package to less than 100° C. during operation.

To address the heat problem, some have reduced the thickness of the semiconductor die (e.g., to about 4–5 mils) using conventional wafer thinning processes (e.g., lapping). Reducing the amount of semiconductor material in the die also reduces the amount of heat retained by the semiconductor die. While decreasing the thickness of a semiconductor die causes it to retain less heat, a thinner semiconductor die can undesirably lead to a decrease in the breakdown voltage of the transistor.

Embodiments of the invention address these and other problems.

SUMMARY OF THE INVENTION

Embodiments of the invention are directed to semiconductor die packages.

One embodiment of the invention is directed to a semiconductor die package comprising: a semiconductor die comprising a vertical power transistor, wherein the semiconductor die has a first surface and a second surface; a source region at the first surface of the semiconductor die; a gate at the first surface of the semiconductor die; a drain region at the second surface of the semiconductor die; a ground plane proximate the second surface and distal to the first surface; and a bus member covering a portion of the first surface of the semiconductor die and having at least one leg, wherein the bus member electrically couples the source region of the semiconductor die to the ground plane.

Another embodiment of the invention is directed to a semiconductor die package comprising: a semiconductor die comprising a vertical power transistor, wherein the semiconductor die has a first surface and a second surface; a source region at the first surface of the semiconductor die; a gate at the first surface of the semiconductor die; a drain region at the second surface of the semiconductor die; a ground plane proximate the second surface and distal to the first surface; a conductive layer between the ground plane and the semiconductor die; an isolator layer disposed between the conductive layer and the ground plane; a bus member covering a major portion of the first surface of the semiconductor die and electrically coupling the source region of the semiconductor die to the ground plane; a carrier enclosing the semiconductor die and the bus member; a drain lead passing through the carrier; a first electrical conductor coupling the drain lead to the conductive layer and the drain region; a gate lead passing through the carrier; and a second electrical conductor coupling the gate lead to the gate.

Another embodiment of the invention is directed to a semiconductor die package comprising: a semiconductor die comprising a vertical power transistor, wherein the semiconductor die has a first surface and a second surface; an emitter region at the first surface of the semiconductor die; a base region at the first surface of the semiconductor die; a collector region at the second surface of the semiconductor die; a ground plane proximate the second surface and distal to the first surface; and a bus member covering a portion of the first surface of the semiconductor die and having at least one leg, wherein the bus member electrically couples the emitter region of the semiconductor die to the ground plane.

Another embodiment of the invention is directed to a semiconductor die package comprising: a semiconductor die comprising a transistor, wherein the semiconductor die has a first surface and a second surface; a source region in the semiconductor die; a gate in the semiconductor die; a drain region in the semiconductor die; a ground plane proximate the second surface and distal to the first surface; and a bus member covering a portion of the first surface of the semiconductor die and having at least one leg, wherein the bus member electrically couples the source region of the semiconductor die to the ground plane.

These and other embodiments can be described with reference to the foregoing Figures and Detailed Description.

It is understood that the Figures may be simplified for purposes of illustration. For clarity of illustration, the proportions of the illustrated elements may be different than those in an actual device.

DETAILED DESCRIPTION

Embodiments of the invention are directed to semiconductor die packages. The die packages can be used in RF power applications and can include power transistors. The power transistors can be used in high output power applications (e.g., in the range of 80 to 100 Watts, or more). In some embodiments of the invention, the semiconductor dies include transistors that can be used as active devices in an RF power amplifier. Such amplifiers may operate at frequencies in a range from below 1 MHz to 2 GHz and above.

The transistor devices in the semiconductor dies can include vertical power transistors or lateral power transistors (LDMOS). In a typical LDMOS device, the gate, source region, and the drain region would be at the same side of a semiconductor die. LDMOS devices are known to those of ordinary skill in the art.

Vertical power transistors are preferred. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces. In other embodiments, the transistors in the semiconductor dies can be bipolar transistors such as IGBTs (insulated gate bipolar transistors). In such embodiments, one side of the semiconductor die can have an emitter region and a base region. The other side of the die can have a collector region.

Vertical power transistor devices have advantages over LDMOS devices. For example, the cells in a VDMOS are smaller and more dense than the cells in an LDMOS device, since the source region and the drain region in a VDMOS device are at opposite sides of the semiconductor die. Consequently, a VDMOS device can have a lower "on" resistance than an LDMOS device. Also, VDMOS devices generally exhibit higher gain and higher saturation current than LDMOS devices.

Figure 2:
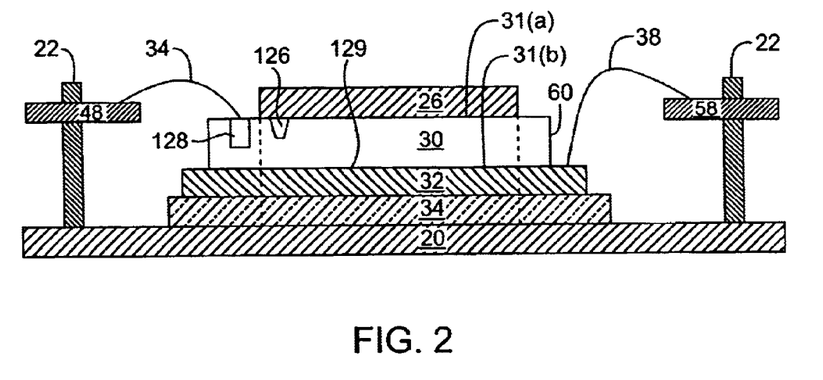
FIG. 2 shows a side cross-sectional view of a semiconductor package according to an embodiment of the invention.

FIG. 2 shows a semiconductor die 30 comprising an RF VDMOS power transistor on a conductive layer 32. The semiconductor die 30 includes a first surface 31(a) and a second surface 31(b) opposite to the first surface 31(a). In this example, the first surface 31(a) of the semiconductor die 30 is distal to the conductive layer 32, while the second surface 31(b) of the semiconductor die 30 is proximate to the conductive layer 32. A trench gate structure 128 and a source region 126 are at the first surface 31(a), while a drain region 129 is at the second surface 31(b). Although a trench gate structure 128 is shown, the gate structure could alternatively be planar. For clarity of illustration, FIG. 2 shows a partial depiction of some components of one transistor cell. Other embodiments can include multiple source and/or multiple gate regions corresponding to multiple cells in the semiconductor die 60.

The semiconductor die 30 and the conductive layer 32 may comprise any suitable material and may have any suitable thickness. Examples of suitable semiconductor materials include silicon and gallium arsenide. Examples of suitable materials for the conductive layer 32 include aluminum, copper clad aluminum, copper, and the like.

The conductive layer 32 is attached to an isolator layer 34 and is also between the isolator layer 34 and the semiconductor die 30. The isolator layer 34 may comprise an electrically insulating material that has high thermal conductivity. Examples of suitable materials that can be used in the isolator layer 34 may include beryllium oxide and diamond.

The isolator layer 34 is also attached to a ground plane 20 so that the isolator layer 34 and the conductive layer 32 are between the ground plane 20 and the semiconductor die 30. The ground plane 20 may be a metal substrate that can also serve as a heat sink and may also provide source current for the semiconductor die 30.

The isolator layer 34, the conductive layer 32, and the ground plane 20 may be first formed as three separate layers, which may be bonded together (e.g., through a direct bond process). Each of these layers 20, 32, 34 could be a substantially continuous layer of material prior to bonding. Alternatively, the three layers 20, 32, 34 could be layers in a unitary body such as a metallized circuit substrate, where the layers 20, 32, 34 can be formed in sequence on each other.

A ceramic carrier 22 may be supported by the ground plane 20. The ceramic carrier 22 may include walls that enclose the semiconductor die 30, a bus member, 26, the conductive layer 32, and the isolator layer 34. A ceramic cover (not shown) may also be on the walls of the ceramic carrier 22 to protect the semiconductor die 30.

A gate lead 48 and a drain lead 58 pass through the ceramic carrier 22 from opposite sides of the carrier 22. Conductive wires 34, 38 respectively couple the gate lead 48 to the gate 128 and the drain lead 58 to the conductive layer 32, which is adjacent to the drain region 129. As will be explained in further detail below, the conductive wires 34, 38 could alternatively be bus members having legs with different lengths.

The bus members according to embodiments of the invention can have flat portions that form angles. For instance, the bus member 26 shown in FIG. 2 has a horizontal portion coupled to the source region 126 of the semiconductor die 30 and at least one leg that extends downward toward the ground plane 20. Preferably, the bus member 26 has two (or more) legs that extend to the ground plane 20 at opposite ends of the semiconductor die 30. The bus member 26 electrically couples the ground plane 20 to the source region 126. One leg is shown by the dotted lines in FIG. 2. In some embodiments, the horizontal portion of the bus member 26 can be a continuous body of metal and can cover a major portion of the first surface 31(a) of the semiconductor die 30 (e.g., greater than 50% of the area of the first surface 31(a)). Solder in the form of hemispherically shaped logs, balls, columns, etc. can be used to electrically couple the horizontal portion of the bus member 26 to various source region connections at the first surface 31(a) of the semiconductor die 30. Solder can also be used to couple the ends of the one or more legs of the bus member 26 to the ground plane 20.

Although FIG. 2 shows a semiconductor die with a vertical transistor, the bus members according to embodiments of the invention could also be used with lateral transistors such as LDMOS transistors. With reference to FIG. 2, instead of having the drain region 129 at the second surface 31(b), in an LDMOS, the drain region would be at the first surface 31(a) along with the source region and the gate. A bus member could electrically couple the source region of the LDMOS to a ground plane underneath the semiconductor die on the opposite side as the source region. Heat can be removed from both sides of the semiconductor die, i.e., through the ground plane and through the bus member. In an LDMOS embodiment such as this, the drain region could be coupled to a drain terminal with wires or another bus member. The isolator layer 34 shown in FIG. 2 would not be needed in the LDMOS embodiment.

Figure 3:
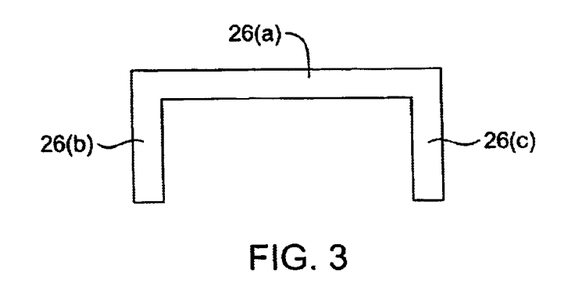
FIG. 3 shows a side view of a bus member according an invention embodiment.

A side view of a bus member 26 is shown in FIG. 3. The bus member 26 may have a horizontal portion 26(a) and two legs 26(b), 26(c) at opposing ends of the horizontal portion 26(a). The two legs 26(b), 26(c) have substantially equal lengths. The semiconductor die, the conductive layer, and the isolator layer may be disposed between the two legs in the semiconductor package. Although this bus member 26 has two legs, a suitable bus member could have one leg in other embodiments.

The bus member 26 may be made of any suitable electrically conductive material. The bus member 26 also preferably includes a thermally conductive material. Exemplary materials that can be used in a bus member 26 include copper, aluminum, and alloys thereof. Most metals have a thermal conductivity greater than about 50 W/m·K and can be used in the bus member 26.

Figure 4:
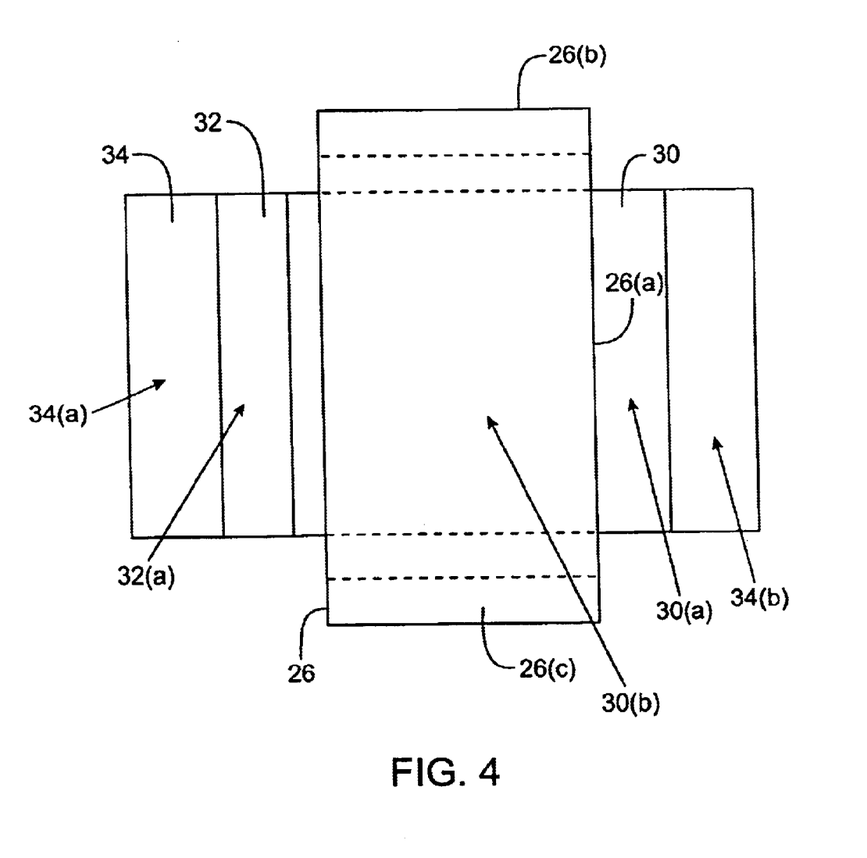
FIG. 4 shows a top view of a portion of a semiconductor package according to an embodiment of the invention.

FIG. 4 shows a top plan view a portion a semiconductor die package with the inner leg surface of the bus member 26 shown by dotted lines. As shown in FIG. 4, the horizontal portion 26(a) can cover a majority of the upper surface of the semiconductor die 30. An area 30(b) of the semiconductor die 30 under the horizontal portion 26(a) of the bus member 26 can include source regions. An exposed area 30(a) to a side of the horizontal portion 26(a) and that is not covered by the bus member 26 can have connections to a gate.

In FIG. 4, the isolator layer 34 and the conductive layer 32 are also shown. A portion 32(a) of the conductive layer 32 is exposed. A conductive wire (not shown) or other conductor may be soldered to this exposed portion 32(a) so that a connection can be made to the conductive layer 32, which is coupled to the drain region of the semiconductor die 30. Two areas 34(a), 34(b) of the isolator layer 34 are also exposed. These areas 34(a), 34(b) may optionally contain circuitry (e.g., matching circuitry) if desired.

Using a bus member instead of conductive wires to electrically couple the source region of a semiconductor die to the ground plane has a number of advantages. A consideration in power RF package design is the use of the source terminal, which is the reference ground, as a thermal conduction path. The use of the source terminal as a thermal path minimizes both the series inductance and the thermal resistance. The bus member can serve as both a thermal path (i.e., it can act as a heat sink) and a low resistance electrical path to the source electrode. Consequently, series inductance and thermal resistance are reduced. Furthermore, the bus member grounds the source electrode of the semiconductor die. By grounding the source electrode, distortion in the signal is minimized.

The bus member also acts as a heat sink. For example, referring again to FIG. 1, heat can be removed from the semiconductor die 30 through the bus member 26 and the combination of the conductive layer 32, the isolator layer 34, and the ground plane 20. Heat is thus removed from both of the major surfaces of the semiconductor die 30 to keep it at a suitable operating temperature. It can be maintained at a suitable operating temperature without reducing the thickness of the semiconductor die 30. In comparison, in the typical LDMOS package above, heat is removed from only one side of a semiconductor die (see, e.g., FIG. 1) that may have reduced thickness. By improving the heat dissipation properties of the die package, the maximum operating power of the package can be increased and the likelihood of device failure due to excessive heating is reduced. Of course, it is understood that embodiments of the invention could also have semiconductor dies of reduced thickness if additional heat dissipation properties are desired.

Figure 5:
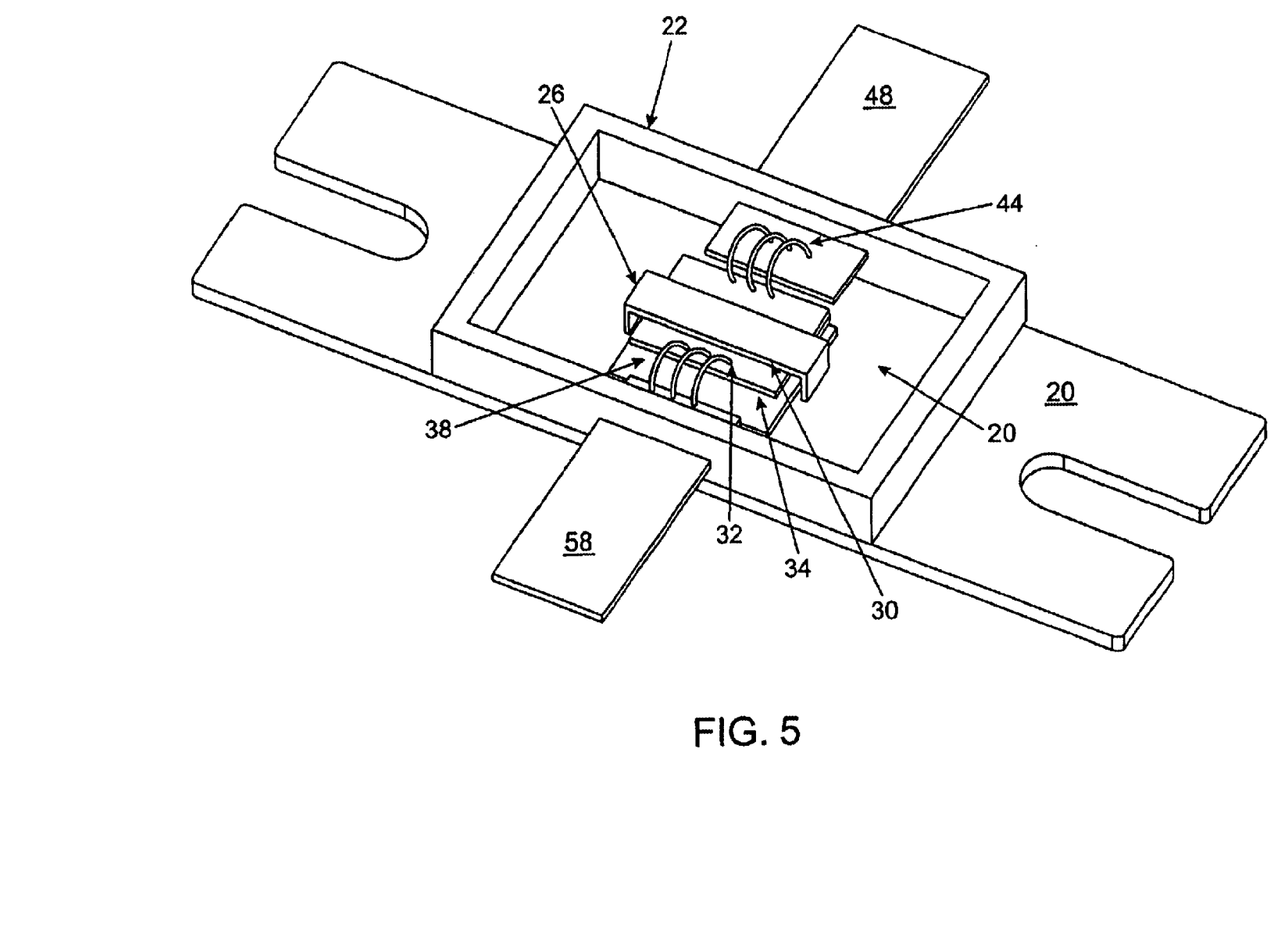
FIG. 5 shows a perspective view of a semiconductor package according to an embodiment of the invention.

In addition, in the die package embodiment shown in FIG. 5, wires need not be used to supply source current to the semiconductor die or transport drain current away from the semiconductor die. The conductors that contact the source electrode and the drain electrode of the semiconductor die are relatively wide and flat, thus reducing the likelihood of inductance in the conductors. Eliminating wires connecting to the drain/collector and/or source/emitter of a power transistor can decrease the inductance of the input and output terminals of the package. Low inductance in, for example, the output signal path of the power transistor package minimizes signal degradation, attenuation, and distortion. Moreover, since the bus members have wider regions for electrical connection than wires, they can be more securely attached to, for example, a semiconductor die than wires. Also, since the bus members are wider than wires, they are stronger than wires and are less likely to break than wires during processing or during the lifetime of the package.

FIG. 5 shows a perspective view of a semiconductor die package according to an embodiment of the invention. In FIGS. 1 and 5, like numerals designate like elements and the discussion of like elements is applicable to the semiconductor die package in FIG. 5.

FIG. 5 shows a better view of the ceramic carrier 22 and the ground plane 20. The ceramic carrier 22 has four walls that enclose the semiconductor die 30, the bus member 26, the conductive layer 32, and the isolator layer 34. The gate lead 48 and the drain lead 58 are at right angles with respect to the orientation of the ground plane 20.

Figure 6:
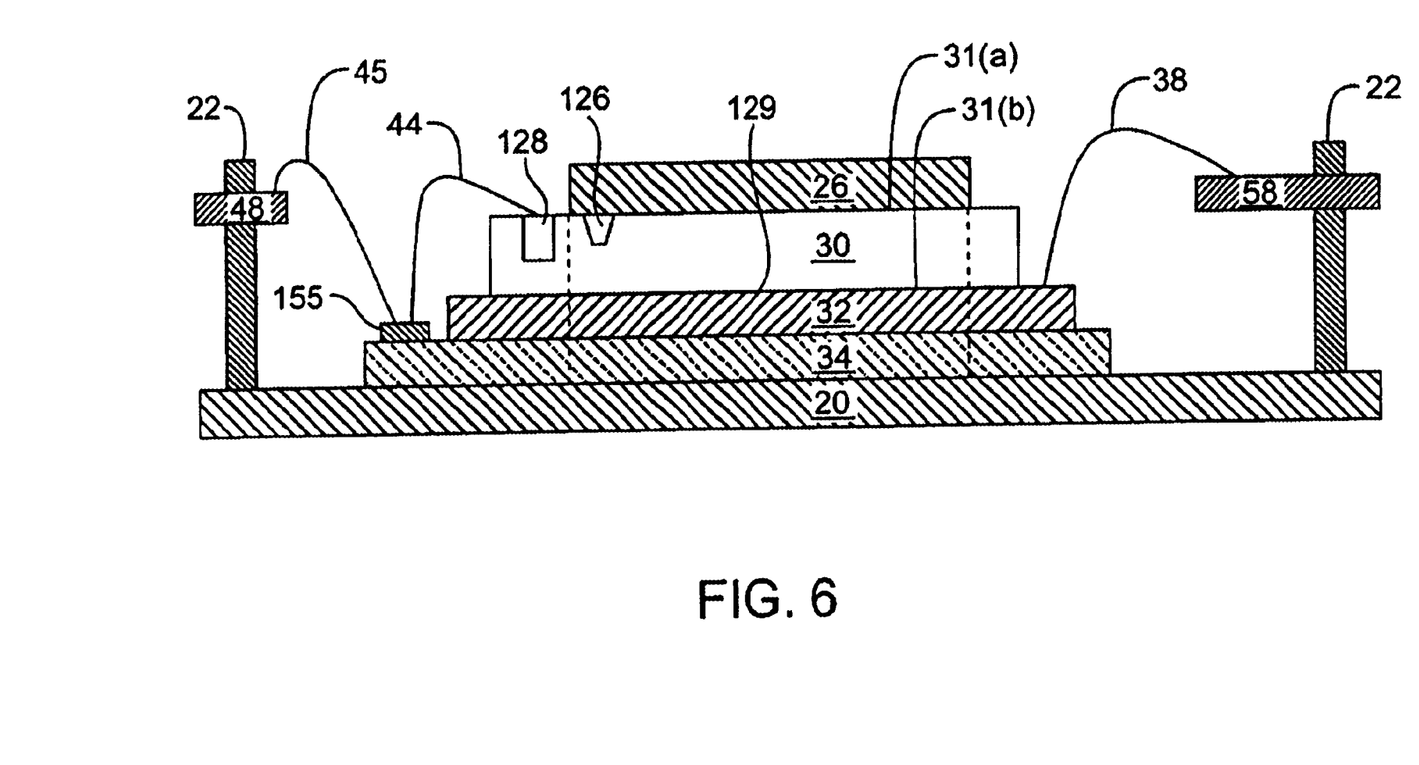
FIG. 6 shows a side cross-sectional view of another semiconductor package according to an embodiment of the invention.

FIG. 6 shows a side cross-sectional view of another semiconductor die package according to an embodiment of the invention. In FIGS. 1 and 6, like numerals designate like elements and the discussion of like elements in FIG. 1 applies to the semiconductor die package shown in FIG. 6.

In the embodiment illustrated in FIG. 6, however, the semiconductor package includes a matching network 155 (e.g., a Q matching network) and conductive wires 44, 45 coupling the matching network 155 to the gate lead 48 and the gate 128. The matching network 155 provides impedance matching between, for example, an input signal from an energy source and a power transistor. Impedance matching maximizes the amount of power transferred from an energy source to the power transistor. For example, commonly used transmission line systems and antennae systems have a nominal impedance of 50 ohms. Semiconductor devices that are used with these systems often have a lower output impedance. The impedances can be adjusted and matched using the matching network so that maximum power is transferred to the output of the power transistor.

The matching network 155 may comprise any suitable circuitry including inductors and/or capacitors. Suitable matching networks and components for matching networks are commercially available and can be selected in accordance with the particular frequency of operation.

In some embodiments, the matching network 155 may include semiconductor die capacitors (silicon MOS capacitors). These capacitors can be used to tune either or both of the input and/or output terminals of the power transistor. The MOS capacitors can be coupled to the transistor terminals using parallel small diameter wires so that the capacitance and inductance can be adjusted to specifically match the input and/or output signal of the power transistor to an amplifier circuit. For example, any suitable number of wires 44 may be bonded to the gate 128 and the matching network 155 to tune the input terminal of the power transistor.

Many of the previously described embodiments use wires to couple the gate lead to the gate of a semiconductor die. Wires are also described as coupling the conductive layer, which is under the drain region of a semiconductor die, to the gate lead. However, in other embodiments, other conductive structures can be used. For example, one or more bus members can be used to respectively couple the conductive layer under the drain region to the drain lead. One or more bus members may also be used to couple the gate to the gate lead of the semiconductor die package.

Figure 7:
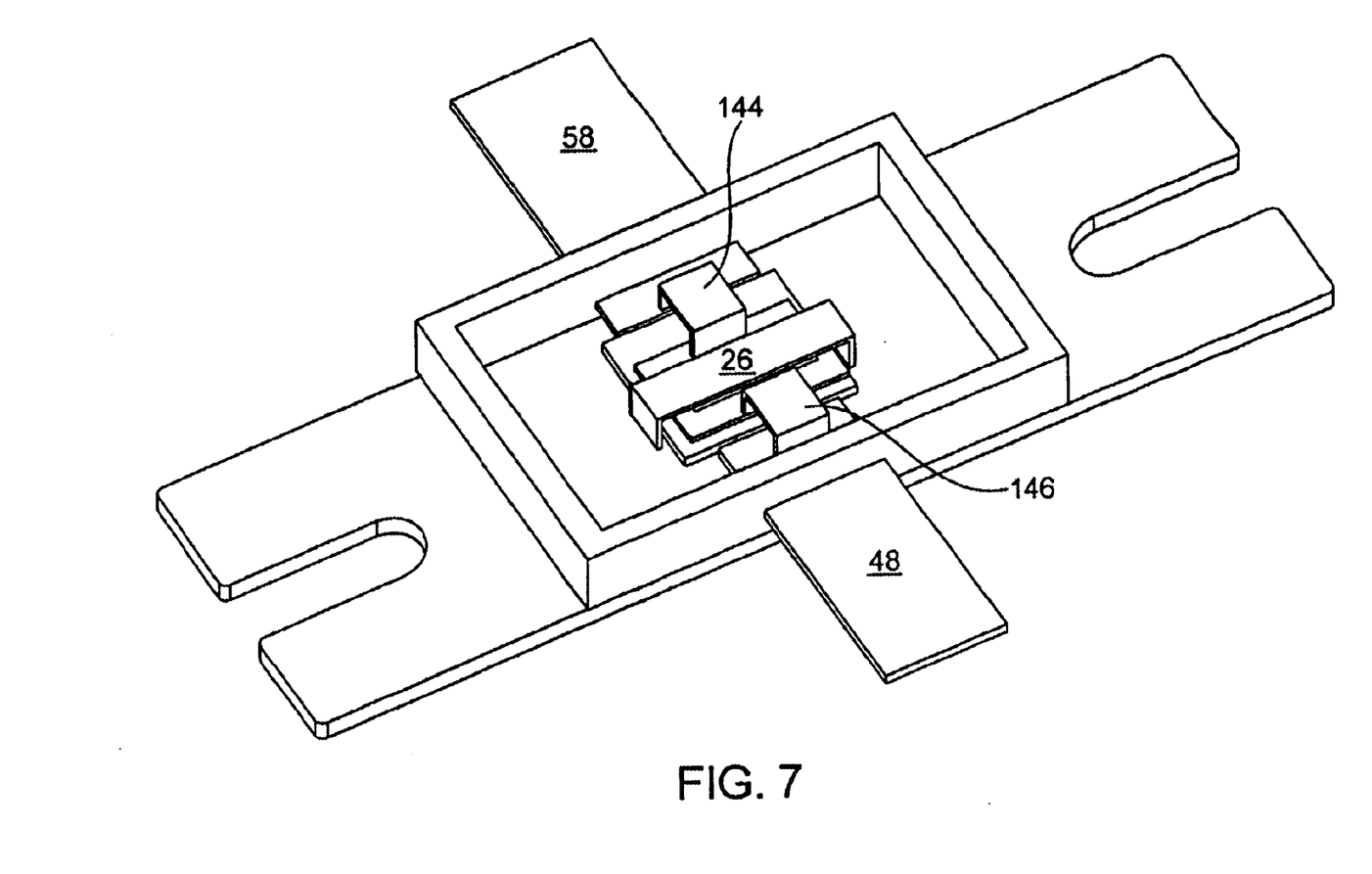
FIG. 7 shows a perspective view of another semiconductor package according to an embodiment of the invention.

Referring to FIG. 7, a first bus member 26 is disposed over a semiconductor die (as described before). Here, however, a second bus member 144 couples the conductive layer to the drain lead 58. A third bus member 146 couples the gate region of the semiconductor die to the gate lead 48. Solder may be used to attach the ends of the legs of each of the bus members 26, 144, 146 to the ground plane, gate region, conductive layer, gate lead, drain lead, etc. The second and third bus members 144, 146 respectively provide low resistance electrical paths between the conductive layer and the drain lead 58, and the gate region and the gate lead 48. In each of the second and third bus members 144, 146, the legs may have different lengths to accommodate the higher elevation of the gate lead 48 and the drain lead 58 relative to the conductive layer and the upper surface of the semiconductor die.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention.

What is claimed is:

1. A semiconductor die package comprising:
   a semiconductor die comprising a vertical power transistor, wherein the semiconductor die has a first Surface and a second surface;
   a source region at the first surface of the semiconductor die;
   a gate at to first surface of the semiconductor die;
   a drain region at the second surface of the semiconductor die;
   a ground plane proximate the second surface and distal to the first surface; and
   a bus member covering a portion of the flit surface of the semiconductor die and having at least one leg, wherein the bus member electrically couples the Source region of the semiconductor die to the ground plane.

2. The semiconductor die package of claim 1 wherein the vertical power transistor is a vertical diffused metal oxide semiconductor (VDMOS).

3. The semiconductor die package of claim 1 further comprising:
   an isolator layer between the ground plane and the semiconductor die.

4. The semiconductor die package of claim 1 further comprising:
   an isolator layer between the ground plane and the semiconductor die; and
   a conductive layer between the isolator layer and the semiconductor die.

5. The semiconductor die package of claim 1 further comprising:
   an isolator layer between the pound plans and the semiconductor die;
   a conductive layer between the isolator layer and the semiconductor die; and
   a ceramic carrier enclosing the semiconductor die, the bus member, the isolator layer, and the conductive layer.

6. The semiconductor die package of claim 1 wherein the vertical power transistor is a vertical diffused metal oxide semiconductor (VDMOS) RF power transistor.

7. The semiconductor die package of claim 1 further comprising:
   an isolator layer between the ground plane and the semiconductor die;
   a conductive layer between the isolator layer and the semiconductor die;
   a ceramic carrier enclosing the semiconductor die, the bus member, the isolator layer, and the conductive layer;
   a drain lead pausing through the ceramic carrier;
   a first wire coupling the drain lead to the drain region via the conductive layer;
   a gate lead passing through the ceramic carrier; and
   a second wire coupling the gate lead to the gate.

8. The semiconductor die package of claim 1 further comprising a matching network electrically coupled to the gate.

9. The semiconductor die package of claim 1 further comprising:
   an isolator layer between the ground plane and the semiconductor die;
   a matching network on the isolator layer;
   a conductive layer between the isolator layer and the semiconductor die;
   a ceramic carrier enclosing the semiconductor die, the bus member, the isolator layer, and the conductive layer;
   a drain lead passing through the ceramic carrier;
   a first wire coupling the drain lead to the drain region via the conductive layer;
   a gate lead passing through the ceramic carrier;
   a second wire coupling the gate lead to the matching network; and
   a third wire coupling the gate to the matching network.

10. The semiconductor die of claim 1 wherein the gate is a trenched gate.

11. A semiconductor die package comprising:
    a semiconductor die comprising a vertical power transistor, wherein the semiconductor die has a first surface and a second surface;

a source region at the first surface of the semiconductor die;

a gate at the first surface of the semiconductor die;

a drain region at the second surface of the semiconductor die;

a ground plane proximate the second surface and distal to the first surface;

a conductive layer between the ground plant and the semiconductor die; an isolator layer disposed between the conductive layer and the ground plane;

a bus member covering a major portion of the first surface of the semiconductor die and electrically coupling the source region of the semiconductor die to the ground plane;

a carrier enclosing the semiconductor die and the bus member;

a drain lead passing through the carrier;

a first electrical conductor coupling the drain lead to the conductive layer and the drain region;

a gate lead passing through the carrier; and a second electrical conductor coupling the gate lead to the gate.

12. The semiconductor die package of claim 11 wherein the bus member is a first bus member and wherein the first electrical conductor is a second bus member and the second electrical conductor is a third bus member, wherein the second and third bus members each have a pair of legs with different lengths.

13. The semiconductor die package of claim 11 wherein the vertical power transistor is a vertical diffused metal oxide semiconductor (VDMOS) RF power transistor.

14. The semiconductor die package of claim 11 further comprising:

a matching network coupled to the gate.

15. The semiconductor die of claim 11 wherein the bus member is a first bus member and wherein the first electrical conductor is a second bus member and the second electrical conductor is a third bus member, and wherein the first, second, and third bus members each have a horizontal portion and two legs that are perpendicular to the horizontal portion.

16. A semiconductor die package comprising:

a semiconductor die comprising a vertical power transistor, wherein the semiconductor die has a first surface and a second surface;

an emitter region at the first surface of the semiconductor die;

a base region at the first surface of the semiconductor die;

a collector region at the second surface of the semiconductor die;

a ground plane proximate the second surface and distal to the first surface; and a bus member covering a portion of the first surface of the semiconductor die and having at least one leg, wherein the bus member electrically coup lea the emitter region of the semiconductor die to the ground plane.

17. The semiconductor die package of claim 16 wherein the bus member comprises two legs of substantially equal length.

18. A semiconductor die package comprising:

a semiconductor die comprising a transistor, wherein the semiconductor die has a first suffice and a second surface;

a source region in the semiconductor die;

a gate in the semiconductor die;

a drain region in the semiconductor die;

a ground plane proximate the second surface and distal to the first surface; and a bus member covering a portion of the first surface of the semiconductor die and having at least one leg, wherein the bus member electrically couples the source region of the semiconductor die to the ground plane.

19. The semiconductor die package of claim 18 wherein the source region, the gate, and the drain region are at the first surface of the semiconductor die.

* * * * *

UNITED STATES PATENT AND TRADEMARK OFFICE
CERTIFICATE OF CORRECTION

PATENT NO. : 6,674,157 B2
DATED : January 6, 2004
INVENTOR(S) : Dennis Lang

It is certified that error appears in the above-identified patent and that said Letters Patent is hereby corrected as shown below:

Column 7,
Line 57, delete "Surface" and insert therefor -- surface --.
Line 61, delete "to" and insert therefor -- the --.
Line 66, delete "flit" and insert therefor -- first --.

Column 8,
Line 19, delete "pound" and insert therefor -- ground --.

Column 9,
Line 8, delete "plant" and insert therefor -- plane --.

Column 10,
Line 16, delete "coup lea" and insert therefor -- couples --.

Signed and Sealed this

Third Day of August, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,674,157 B2
DATED : January 6, 2004
INVENTOR(S) : Dennis Lang

It is certified that error appears in the above-identified patent and that said Letters Patent is hereby corrected as shown below:

Column 1,
Line 40, delete "a typical" and insert therefor -- atypical --.

Column 8,
Line 37, delete "pausing" and insert therefor -- passing --.

Column 10,
Line 24, delete "suffice" and insert therefor -- surface --.

Signed and Sealed this

Twenty-third Day of November, 2004

JON W. DUDAS
*Director of the United States Patent and Trademark Office*